United States Patent [19]

Shiono et al.

[11] Patent Number: 5,493,224
[45] Date of Patent: Feb. 20, 1996

[54] ULTRA HIGH-SPEED MAGNETIC RESONANCE IMAGING METHOD AND APPARATUS

[75] Inventors: Hidemi Shiono, Akigawa; Kenji Takiguchi, Kodaira; Etsuji Yamamoto, Tokyo, all of Japan

[73] Assignee: Hitachi, Ltd., Tokyo, Japan

[21] Appl. No.: 25,785

[22] Filed: Mar. 3, 1993

[30] Foreign Application Priority Data

Mar. 3, 1992 [JP] Japan .................................. 4-045259
Mar. 16, 1992 [JP] Japan .................................. 4-057667

[51] Int. Cl.⁶ .................................................. G01V 3/00
[52] U.S. Cl. ................................. 324/309; 324/307
[58] Field of Search ........................... 324/300, 301, 324/306, 307, 309, 318, 322

[56] References Cited

U.S. PATENT DOCUMENTS

| | | | |
|---|---|---|---|
| 4,794,337 | 12/1988 | Twieg | 324/309 |
| 4,859,944 | 12/1989 | Kuhara | 324/309 |
| 5,055,789 | 10/1991 | Kondo et al. | 324/309 |
| 5,109,197 | 4/1992 | Onodera et al. | 324/309 |
| 5,221,898 | 6/1993 | Takiguchi et al. | 324/309 |

FOREIGN PATENT DOCUMENTS 64-86959  3/1989  Japan .
2-215440  8/1990  Japan .

OTHER PUBLICATIONS

Journal of Physics C: Solid State Physics, 10, L55, 1977. Mansfield. Multiplanar Image Formation (month unknown).

*Primary Examiner*—Louis M. Arana
*Attorney, Agent, or Firm*—Antonelli, Terry, Stout & Kraus

[57] ABSTRACT

A magnetic resonance imaging method and apparatus employing a pulse sequence including a periodically switched readout gradient and a phase encoding gradient to derive a series of echo signals. Prior to execution of the pulse sequence for acquiring data for imaging, a pulse sequence in which the phase encoding gradient is cancelled is executed to obtain information of deviation in position of echo peaks. Thereafter, a pulse sequence including the phase encoding gradient is executed and at this time, sampling start timings for echo data sampling in respective phase periods of the readout gradient are controlled according to the information of the echo peak deviation. Further, a phase difference between data of odd number echo signals and data of even number echo signals is compensated by rotating either of the data of the odd number echo signals or the even number echo signals by a suitable rotating angle to minimize artifacts.

3 Claims, 8 Drawing Sheets

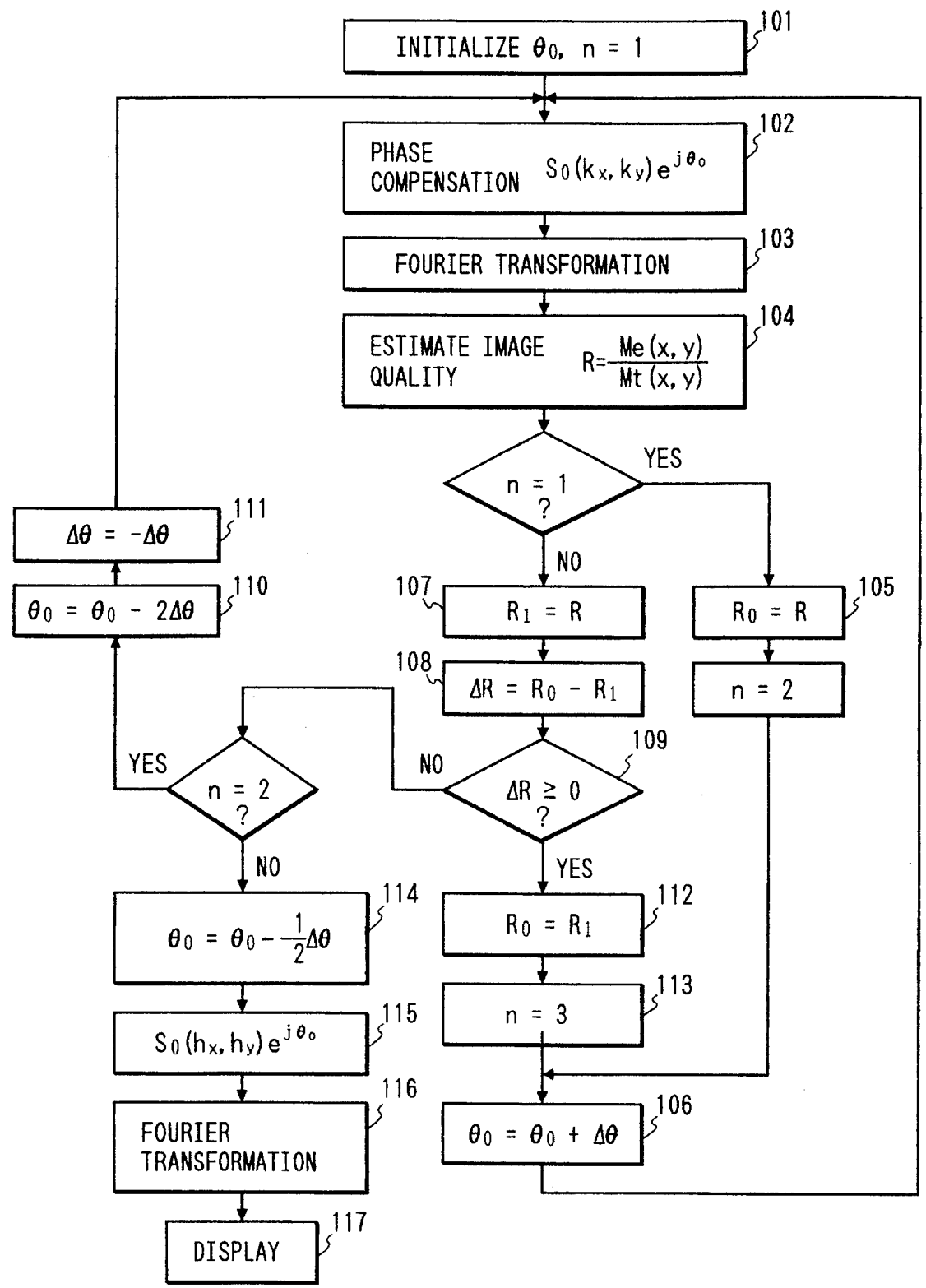

ULTRA HIGH-SPEED MAGNETIC RESONANCE IMAGING METHOD AND APPARATUS

BACKGROUND OF THE INVENTION

The present invention relates to a magnetic resonance imaging method and apparatus employing a periodically switched readout gradient.

A magnetic resonance imaging method which is known as the echo planar method has been proposed in the Journal of Physics C: Solid State Physics, 10, L55, 1977. According to this method, a series of echo signals of excited magnetization are generated and measured by simultaneously applying two kinds of field gradients, i.e., a readout gradient which is switched alternately between gradients of opposite polarity and a continuous phase encoding gradient which is applied along a direction orthogonal to the readout gradient.

Another method known as Hutchison's method utilizes a pulsating phase encoding gradient, which performs rectangular signal scanning in Fourier space, instead of the continuous phase encoding gradient.

According to these methods, signal data for two-dimensional imaging is acquired after a one time excitation of magnetization. Therefore, the measurement time in these methods is much shorter than the measurement time in a magnetic resonance imaging method utilizing multi-time excitations. Various modifications have been proposed for these methods and all of the modifications can be considered to be ultra high-speed magnetic resonance imaging methods.

In general, it is very difficult to adjust the waveform of the readout gradient for obtaining appropriate images by the ultra high speed magnetic resonance imaging method. For example, an eddy current induced in a metal member located near a gradient coil or an offset in the output of a gradient coil driver causes variation in peak position of echo signals in respective phases of the readout gradient, as is described in U.S. Pat. No. 4,859,946 which corresponds to Japanese Patent Application Laid-open No. 86959/1989 and which discloses an imaging system having a peak detection mode in which a phase encoding gradient is not applied and an imaging mode. Peak positions of respective echo signals generated in the peak detection mode are stored in a memory. Sampled data of respective echo signals generated in the imaging mode are stored in another memory and read out for image reconstruction from respective positions of the memory which are corrected according to the stored peak position data. Another imaging system as described in U.S. Pat. No. 4,859,946 includes a correction unit for correcting the waveform of a gradient coil driver in the imaging mode on the basis of the stored peak position data. Both systems are intended to perform an automatic adjustment for obtaining appropriate images. However, it is difficult to perform precise adjustment corresponding to peak position deviations within one sampling interval in such systems.

An imaging system described in U.S. Pat. No. 5,055,789 which corresponds to Japanese Patent Application Laid-open No. 215440/1990 obtains a final image by synthesizing an MR image constructed from echo data acquired when the readout gradient is in positive polarity phases and another MR image constructed from echo data acquired when the readout gradient is in negative polarity phases. Position errors or intensity distribution errors in the both MR images due to inhomogeneity of the static magnetic field or frequency mismatch are respectively corrected before image synthesizing to obtain the final image free from artifacts.

According to an article in Medical & Biological Engineering & Computing, Vol 29, Supplement 1991, by the inventors of the present invention, the phase difference resulting from forward and reverse sampling under an inhomogeneous field in an ultra high-speed magnetic resonance imaging method is determined, and then used for matching in image reconstruction.

SUMMARY OF THE INVENTION

An object of the present invention is to provide an ultra high-speed magnetic resonance imaging method and apparatus in which very fine adjustment of a periodically switched readout gradient is substantially and easily performed.

Another object of the present invention is to practically prevent artifacts in reconstructed images caused due to a phase difference between resonance signals generated when the readout gradient is in positive polarity phases and resonance signals generated when the readout gradient is in negative polarity phases.

According to a feature of the present invention, sampling start timings for respective echo signals in a series of echo signals, which are generated by applying a periodically switched readout gradient in association with a phase encoding gradient after an excitation of magnetization, are controlled respectively on the basis of echo peak position deviation data. The acquired data which represent a series of echoes of the excited magnetization is subjected to two-dimensional Fourier transformation to obtain an image. The echo peak position deviation data is previously derived from another series of echo signals which are generated by applying the readout gradient and without applying the phase encoding gradient after a previous excitation of magnetization.

When a periodically switched readout gradient is applied, an echo peak appears each time when the integral of the readout gradient becomes zero. However, it is very difficult to adjust the waveform of the readout gradient so that the integral becomes zero exactly at the same timing in respective phase of the readout gradient. Further, it is very difficult to detect the timings when the integral of an actual readout gradient becomes zero, if the phase encode gradient is applied in association with the readout gradient. According to the above feature of the invention, the timings when the integral of an actual readout gradient becomes zero can be accurately detected and the deviation of the timings in respective phase periods of the readout gradient can be substantially compensated by control of the sampling start timings.

In accordance with another feature of the present invention, it is also possible to apply both of the readout gradient and the phase encoding gradient to obtain echo peak position deviation data if a thin phantom is placed in a region of interest so as to extend, perpendicularly to the direction of the phase encoding gradient.

Even when an accurate adjustment of sampling start timings is effected, artifacts occasionally appear in a particular area of the resultant images. The amplitude of the artifacts changes occasionally, for example, when an RF probe is replaced by another one, or when the position of the RF probe is changed. The inventors have determined that, in many cases, the artifacts can be eliminated if respective magnetic resonance signal data representing either one of odd number echo signals or even number echo signals are rotated by a common rotating angle before image reconstruction. The artifacts are considered to be caused by a phase difference between the odd number echo signals which are generated while the readout gradient is in one polarity phase and the even number echo signals which are generated while the readout gradient is in opposite polarity phases. The phase difference occasionally changes. However, it has been determined that in many cases that the phase difference is constant in spite of the data allocation of measured signals.

According to further features of the present invention, a method for eliminating artifacts includes the steps of generating and measuring a first series of echo signals by applying a switched readout gradient and without applying a phase encode gradient, detecting a phase difference between odd number echo signals and even number echo signals in the first series of echo signals, generating and measuring a second series of echo signals by simultaneously applying the switched readout gradient and a phase encoding gradient to obtain a data set, compensating phase errors in the data set by rotating respective data representing either one of the odd number echo signals or the even number echo signals in the second series of echo signals by a rotating angle corresponding to the detected phase difference, and reconstructing an image from a compensated data set.

It is also possible to set an initial rotating angle, and to increase or decrease the rotating angle repeatedly while monitoring the change of the quality of resultant image to determine a suitable rotating angle.

These and other objects, features, and advantages of the present invention will become more apparent from the following description when taken in conjunction with the accompanying drawings which show, for purposes of illustration only, several embodiments of the present invention.

BRIEF DESCRIPTION OF THE DRAWINGS

FIG. 10 is a flow chart showing data processing in accordance with another embodiment of the present invention.

DESCRIPTION OF THE PREFERRED EMBODIMENTS

Figure 1:
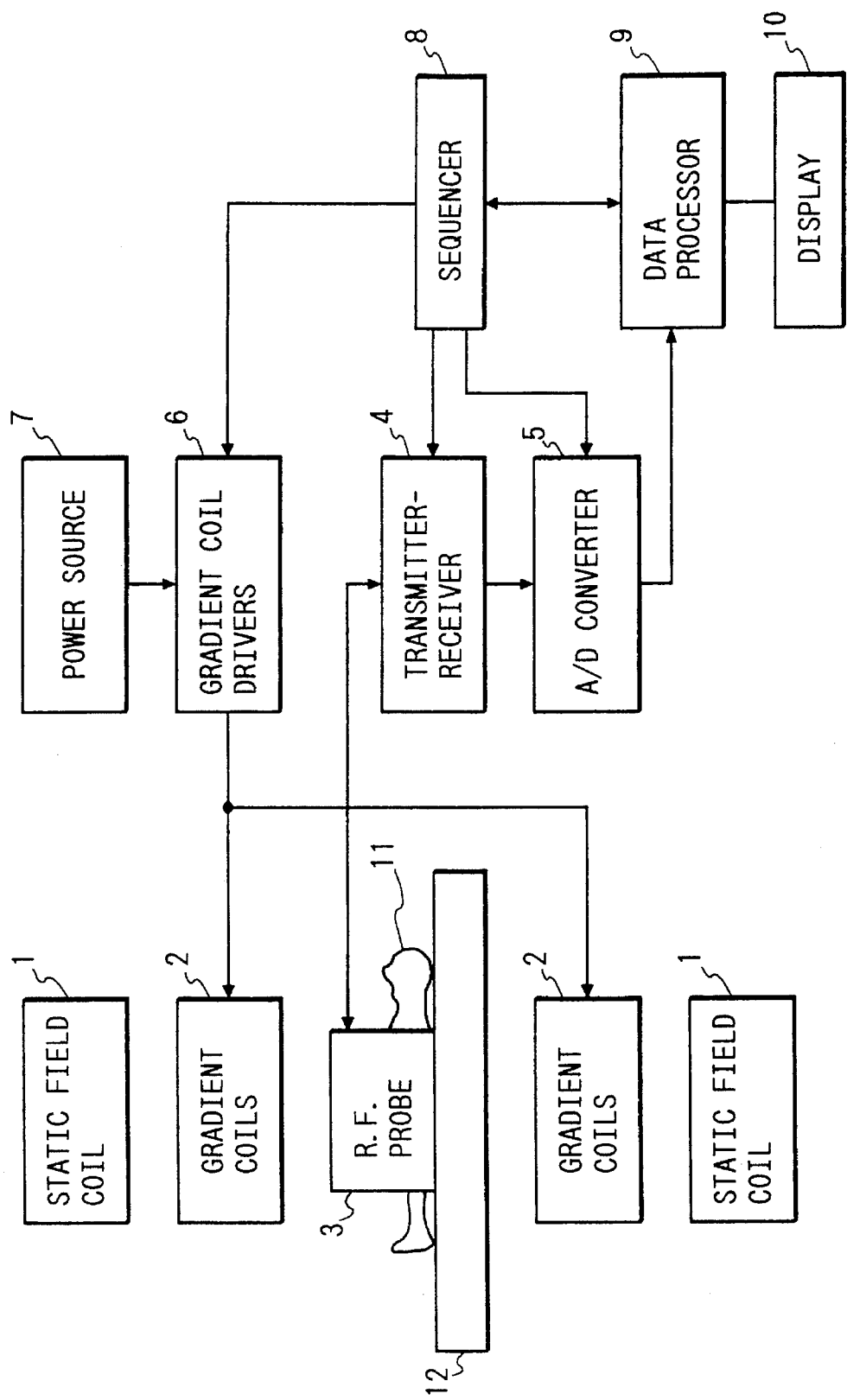
FIG. 1 is a block diagram showing a magnetic resonance imaging system in accordance with the present invention.

FIG. 1 shows an MR imaging system in accordance with the present invention in which a static field coil 1 generates a substantially homogeneous static magnetic field in a limited space. Gradient coils 2 are driven by gradient coil drivers 6 associated with a power source 7 and generate field gradients along three orthogonal directions x, y and z. The waveform of each of the field gradients is individually controlled by sequencer 8. A patient 11 representing an object to be imaged lays on a bed 12 and is inserted into the space within the coils. An RF probe 3 connected to a transmitter-receiver 4 is positioned near a region of interest to be imaged so as to transmit an RF magnetic field to the patient and to receive a magnetic resonance signal from the patient. The waveform of the RF magnetic field is also controlled by the sequencer 8. The transmitter-receiver 4 includes a phase sensitive detector. Quadrature outputs of the detector are sampled and converted into digital data by an A/D converter 5 and stored in a data memory provided in a data processor 9. The sampling timings of the A/D converter 8 is also controlled by the sequencer 8. The data processor 9 executes programs for data processing and forms image data to be displayed by display 10.

Figure 2:
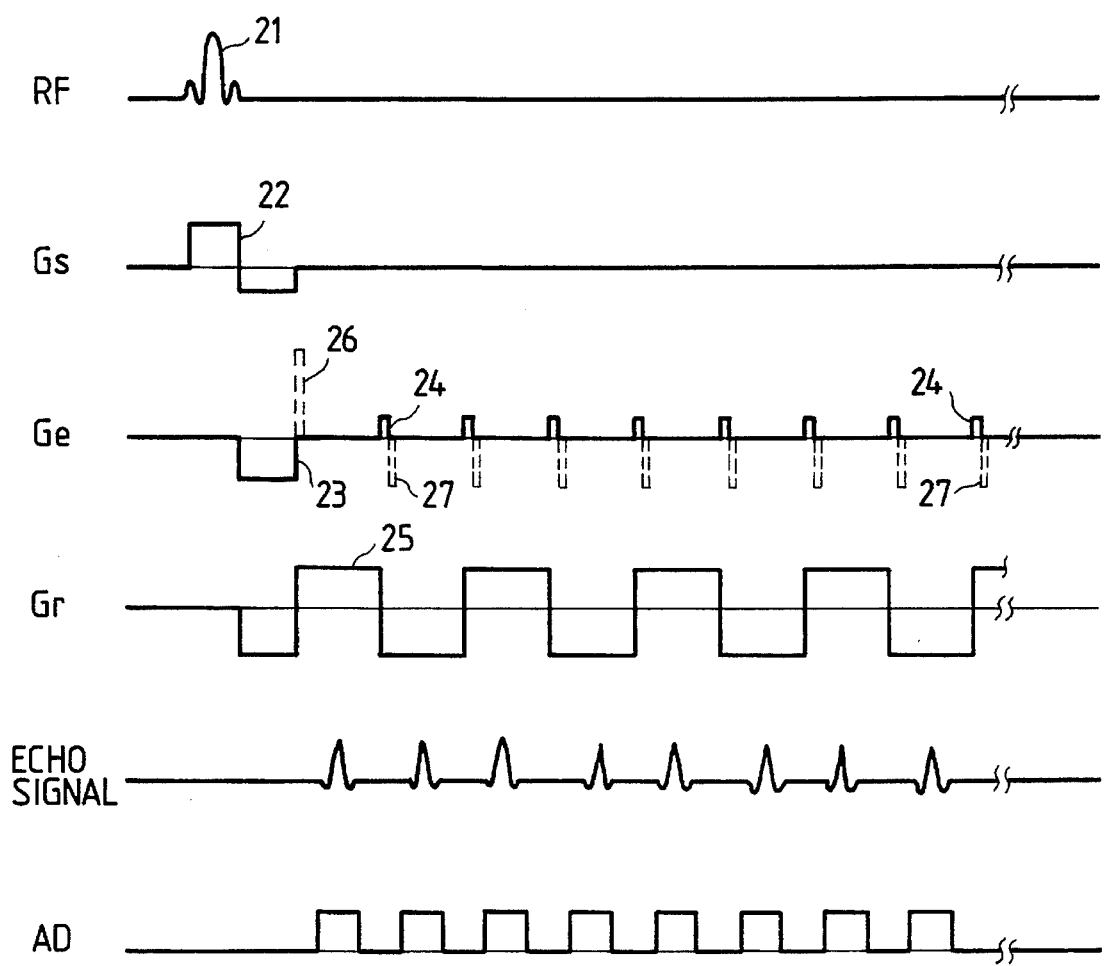
FIG. 2 shows waveforms of a pulse sequence according to an embodiment of the present invention.

FIG. 2 shows waveforms of a pulse sequence according to one embodiment of the present invention wherein Gs, Ge and Gr respectively indicate waveforms of a slice selecting gradient, phase encoding gradient and readout gradient. Generally, three orthogonal field gradients along x, y and z directions are provided respectively corresponding to these gradients.

At first, a pulse sequence, as indicated in FIG. 2 and without applying the phase encoding gradient Ge, is executed to obtain information on echo timing deviation. Namely, an RF magnetic field pulse 21 is generated under the condition that the slice selecting gradient Gs is applied as indicated at 22 to excite magnetization in a region of interest. Then the readout gradient Gr is generated, at first as a negative polarity gradient within a term of a quarter cycle. Thereafter, the readout gradient Gr is switched alternately between positive and negative polarity gradients to form a waveform having a constant cycle as indicated at 25. A series of echo signals is generated by the sequence, and the peak of the echo signal appears each time when an integral of the readout gradient becomes zero. The echo signals are generated by the sequence, and the peak of the echo signal appears each time when an integral of the readout gradient becomes zero. The echo signals are sampled by the A/D converter 5. The time difference between the switching timing of the readout gradient Gr and the sampling start timing for each echo is constant at this measurement, as indicated at AD1 in FIG. 3.

The echo data is stored in a memory, and the waveform of each echo is analyzed in the data processor 9. The data processor 9 calculates a peak position for each of the echo signals. The position difference between a position in the memory corresponding to the center of each half cycle of the readout gradient Gr and the calculated peak position represents the time deviation of the echo signal and is indicated as t1, t2, ..., tn in FIG. 3.

Then, the pulse sequence shown in FIG. 2 is executed to acquire a data set for imaging. The readout gradient Gr is generated in the same manner as in the pulse sequence of peak position detection. At this time, the phase encoding gradient Ge is generated as shown by solid line in FIG. 2. Namely, the phase encode amount of the first echo signal is determined by a phase encoding pulse 23, and the phase encoding amount is stepwisely changed by pulses 24. Further, the sampling start timings in respective phase periods of the readout gradient Gr are controlled as shown at AD2 in FIG. 3, on the basis of the calculated peak positions.

Figure 3:
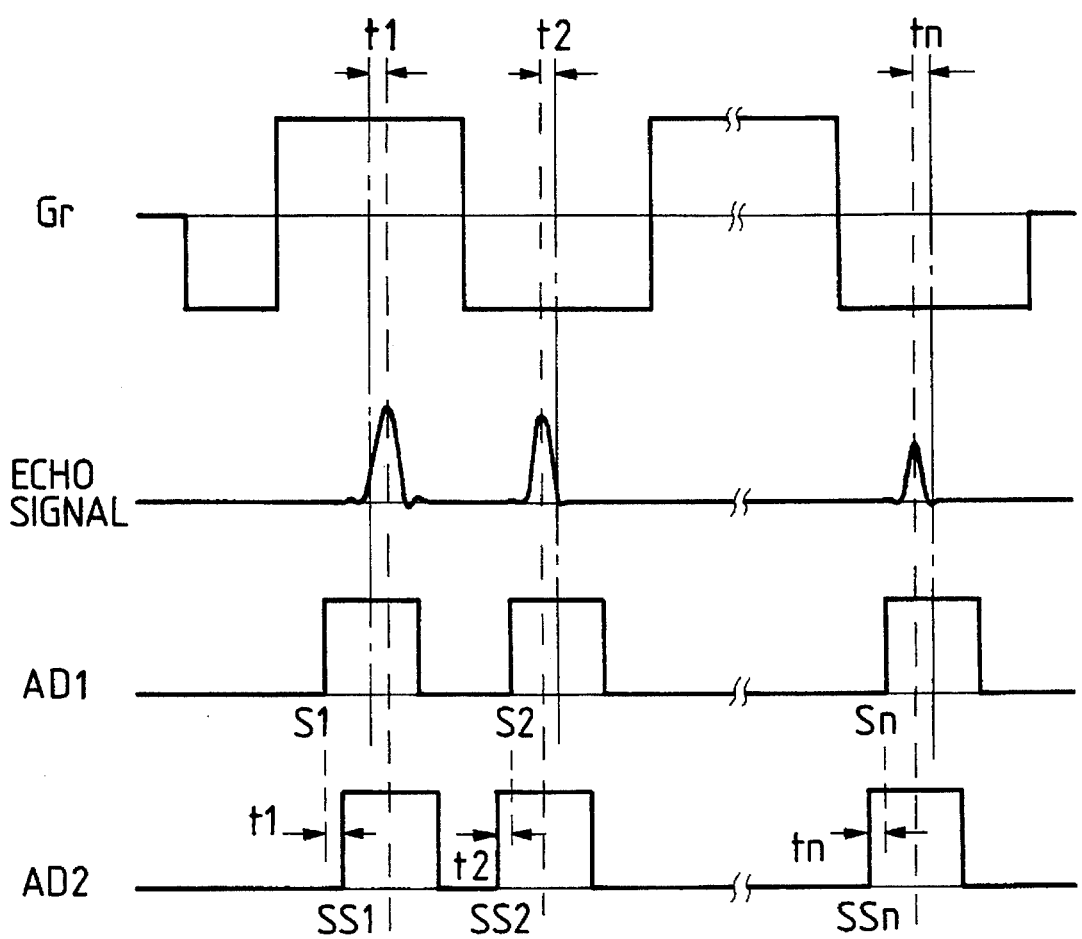
FIG. 3 is a diagram showing a relation among a readout gradient, echo signal and sampling timing in accordance with an embodiment of the present invention.

Namely, the time deviation t1, t2, ..., tn of the echo signals is substantially compensated by shifting the sampling start timings to SS1, SS2, ..., SSn as shown at AD2 in FIG. 3.

The thus obtained data set is subjected to two-dimensional Fourier transformation to form a magnetic resonance image. According to this method, accurate compensation is easily obtained in comparison to the method employing the control of the waveform of readout gradient. Further, fine adjustment corresponding to the time deviation within one sampling period can be effected.

Figure 4:
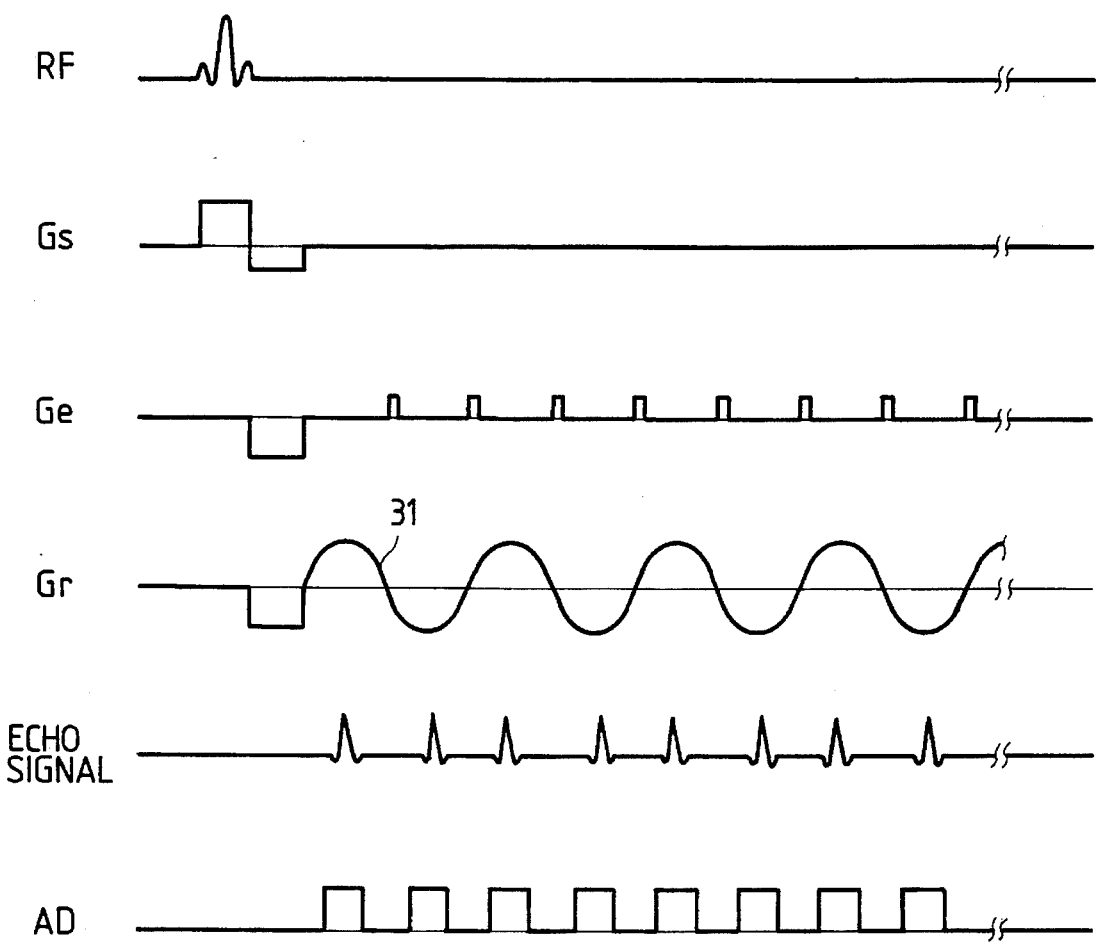
FIG. 4 is a diagram showing a pulse sequence according to another embodiment of the invention.
Figure 5:
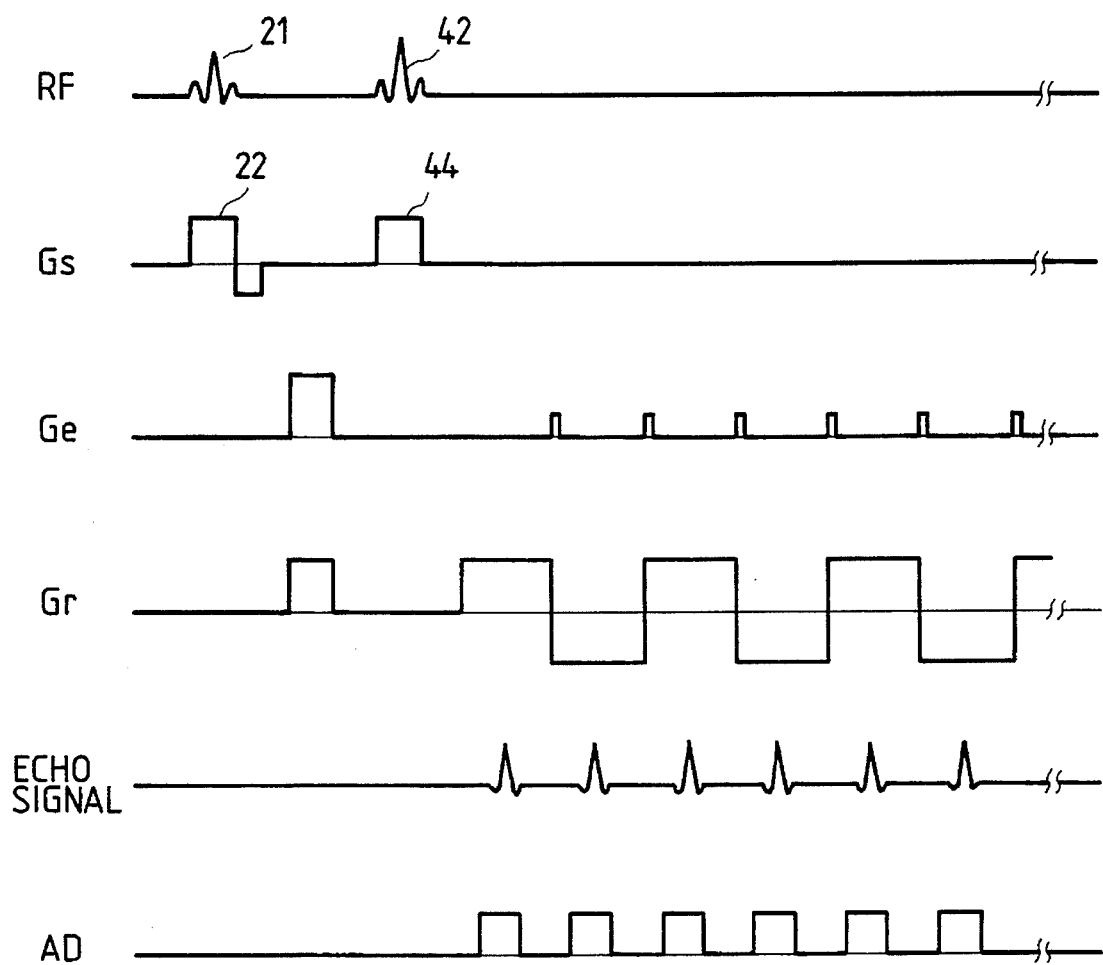
FIG. 5 is a diagram showing a pulse sequence according to a further embodiment of the invention.

The method in the above-mentioned embodiment can be applied to other types of ultra high-speed magnetic resonance imaging sequences. For example, the sequence shown in FIG. 4 employs a readout gradient having a sinusoidal waveform as indicated at 31. In the sequence shown in FIG. 5, a 90° RF pulse 41 and a slice gradient field 43 are applied to excite magnetization and a 180° RF pulse 42 and a slice gradient field 44 are applied after excitation of the magnetization to invert the magnetization. In these imaging sequences, the timing compensation as described above is also effective.

It is also necessary to eliminate the effect of the phase encoding gradient to accurately detect the timings when the integral of the actual readout gradient becomes zero. To realize this condition, a series of gradient pulses including the original phase encoding pulses 23 and 24, and also including additional pulses 26 and 27 shown by broken lines in FIG. 2 are applied in the step of peak position detection. Each of the additional pulses 26 and 27 have a time-gradient product for canceling the effect of each of the original phase encoding pulses.

Figure 6:
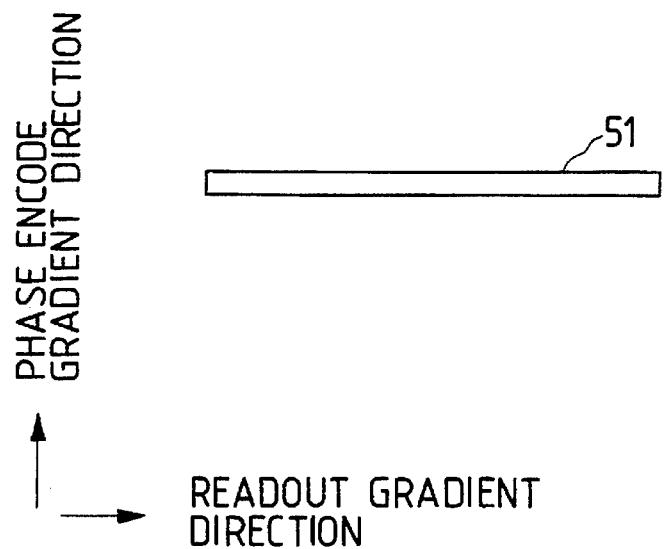
FIG. 6 is a diagram showing the direction of a phantom in accordance with another embodiment of the present invention.

In another embodiment, field gradients are applied in the previous step of peak position detection entirely in the same manner as in the step to acquire data for imaging. In this embodiment, a thin phantom 51 is placed so as to extend within the coils instead of the patient for the step of peak position detection. The phantom 51 is placed so as to extend perpendicularly to the direction of the phase encoding gradient Ge as shown in FIG. 6. The thickness of the phantom is preferably not larger than a distance corresponding to one pixel interval. Such a phantom provides a condition equivalent to one in which the phase encoding gradient is not applied. Accordingly, the timings when the integral of the actual readout gradient becomes zero are accurately detected by using the phantom.

Figure 7:
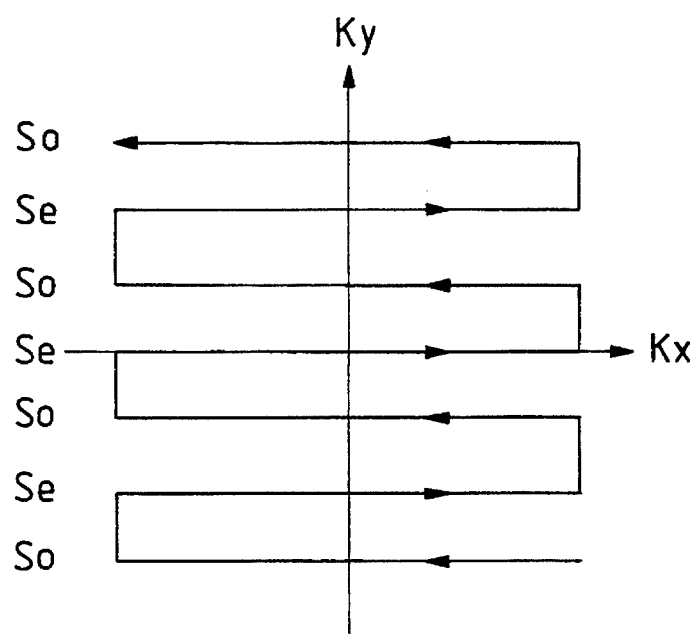
FIG. 7 is an explanatory diagram showing signal allocation in Fourier space in the embodiments.
Figure 8A:
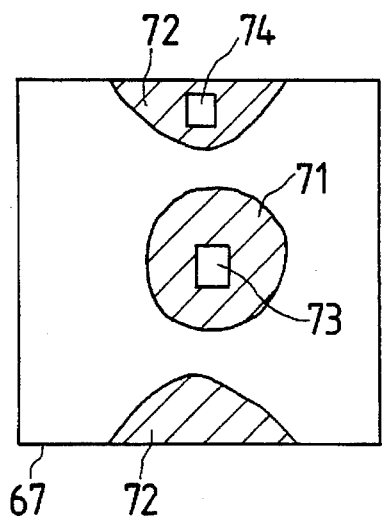
FIGS. 8A and 8B are explanatory diagrams for an image estimation method in accordance with a further embodiment of the present invention.

Even when the waveform of the readout gradient or sampling start timings are accurately adjusted, it has been determined that artifacts of a particular type occasionally appear in the resultant images of a display 67 as shown in FIG. 8A. In FIG. 8A, the vertical axis corresponds to the phase encoding direction, and the horizontal axis corresponds to the frequency encoding direction. In general, the artifacts 72 appear symmetrically above and below a true image 71 of the object as shown in FIG. 8A. It has also been determined that the artifacts are caused by a phase difference between odd number echo signals and even number echo signals, and that, in many cases, the phase difference is constant in spite of signal allocations of the echo signals. FIG. 7 shows the signal allocations of odd number echo signals So and even number echo signals Se in Fourier space in signal rows. This homogeneous phase difference is considered to be caused by the difference in the electrical interference between the RF magnetic field and the field gradient while the readout gradient is in negative polarity phases and while the readout gradient is in positive polarity phases. Accordingly, if all of the data representing odd number echo signals So or all of the data representing even number echo signals Se are rotated by a suitable common rotating angle, the phase difference is compensated.

According to another embodiment of the invention, a measurement sequence for measuring the phase difference is previously executed. The previous measurement sequence is the same as the pulse sequence for peak position detection in the first embodiment of the invention. Namely, the pulse sequence as shown in FIG. 2 without applying the phase encoding gradient Ge is executed. Then a phase difference $\Theta d$ between the phase of sampled data representing odd number echo signals So and the phase of sampled data representing even number echo signals Se is calculated in the data processor. Thereafter, a measurement sequence to obtain a data set for imaging is executed. At this time, the sequence includes the phase encoding gradient Ge as shown in solid line in FIG. 2. Then, all of the echo data representing the odd number echo signals So are rotated by $\Theta d$ to compensate for the phase difference. It is also possible to rotate all of the echo data representing the even number echo signals Se to compensate for the phase difference. The compensated data set is subjected to two-dimensional Fourier transformation to obtain image data.

In this embodiment, the data sampling in the previous measurement step for measuring the phase difference should be performed exactly in the same manner as that in the measurement step to obtain the data set for imaging. It is preferable, however, to apply sampling start timing adjustment as described in connection with the first embodiment to both steps.

It is also possible to employ the phase encoding gradient pulse sequence including the additional pulses 26 and 27 as shown in FIG. 2 in the previous measurement step for measuring the phase difference. Further, it is also possible to insert the thin phantom 51 shown in FIG. 6 instead of the object to be imaged in the previous measurement step, and to employ a pulse sequence exactly the same as that in the measurement step to obtain data for imaging.

Figure 9:
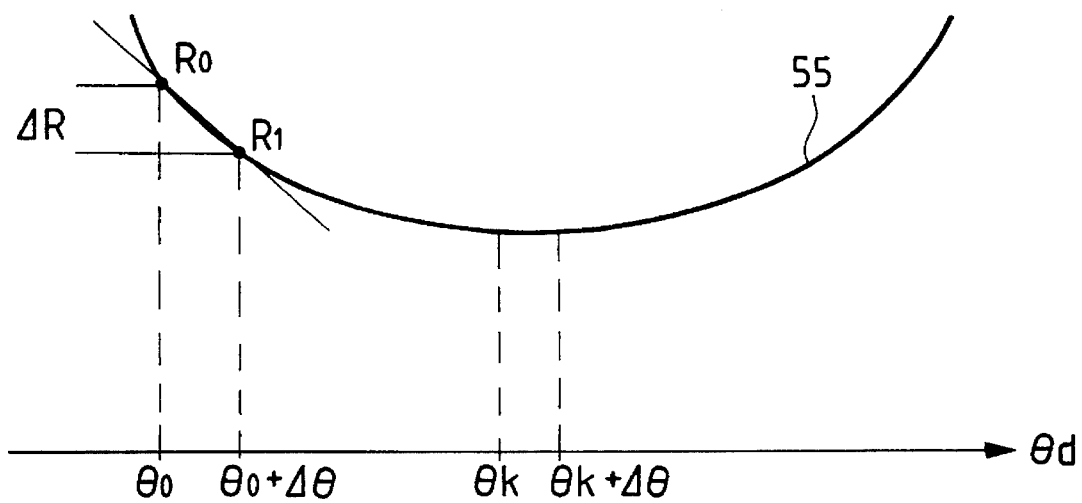
FIG. 9 is a characteristic diagram showing relation between rotating angle and intensity of artifacts in the embodiment of FIGS. 8A and 8B.

The intensity of the artifacts 72 shown in FIG. 8A will monotonously increase in accordance with the absolute value of the phase difference between the data of odd number echo signals So and the data of even number echo signals Se. According to another embodiment shown in FIGS. 9 and 10, a suitable rotating angle for compensating for the phase difference is determined by utilizing the characteristics of the intensity of the artifacts and without employing the previous measurement step for measuring the phase difference.

The flow of processing of an acquired data set in this embodiment is indicated in FIG. 10. At first, an initial value of a rotating angle $\Theta o$ is set, and a parameter n is set to 1 (step 101). The initial value of $\Theta o$ can be arbitrarily decided and may be zero. At step 102, phase compensation is performed on the sampled data set by rotating all of the data representing the odd number echo signals So by $\Theta o$. The phase rotation is performed by multiplying each of the sampled data So(kx,ky) representing the odd number echo signals So by $\exp(j\Theta o)$. At step 103, the compensated data set, including the rotated data So(kx,ky)·$\exp(j\Theta o)$ and data Se(kx,ky) representing the even number echo signals Se, is subjected to two-dimensional Fourier transformation to reconstruct a first trial image. At step 104, the quality of the first trial image is evaluated. In this embodiment, the evaluation is executed by reading out data in two sample regions 73 and 74 of the trial image, as indicated in FIG. 8A, and by deriving a ratio of image intensity of the two sample regions.

The sample region 73 is selected to represent the true image 71 of an object and the sample region 74 is selected to represent artifacts 72. An average amplitude {Me(x,y)} of data in the sample region 74 and an average amplitude {Mt(x,y)} of data in the sample region 73 are respectively calculated. Then, a ratio R between {Me(x,y)} and {Mt(x,y)} is derived as an evaluation value.

At step 105, the evaluation value is stored as Ro. And then, the flow processing proceeds to derive a second trial image and to derive the evaluation value thereof. Namely, the parameter is changed so as to be 2. The value of the rotating angle $\Theta 0$ is increased by $\Delta \Theta$ at step 106. then, the steps for phase compensation (step 102), Fourier transformation on the compensated data set (step 103) and evaluation of the image quality (step 104) are executed. Thus, a second trial image is reconstructed and a new evaluation value R for the second trial image is derived. The new evaluation value is stored as R1 (step 107). Then, a difference $\Delta R$ ($\Delta R = Ro - R1$) is calculated (step 108). If the value $\Delta R$ is negative, it appears that the value of the rotating angle should have been decreased. Accordingly, the value $\Theta o$ is decreased by $2\Delta\Theta$ (step 110), and the value $\Delta\Theta$ is replaced by $-\Delta\Theta$ (step 111). Then, steps 102, 03, 104, 107 and 108 are once again executed. If the value $\Delta R$ is positive, it appears that it is correct to increase the value of the rotating angle $\Theta o$.

Thus, the direction of the change in the rotating angle $\Theta o$ is determined by comparing two trial images. Thereafter, the rotating angle $\Theta o$ is changed (increased or decreased) in a stepwise manner while monitoring the change in the evaluation value R. Namely, the newer evaluation value R1 is stored as Ro (step 112) and the parameter n is changed to be 3 (step 113). Then, the rotating angle is again increased (or decreased) by $\Delta\Theta$ (step 106). A further trail image is reconstructed through steps 102, 103 and 104. The change in the evaluation value is monitored through steps 104, 107, 108 and 109. This routine is repeated until the value $\Delta R$ is determined to be negative at step 109. Accordingly, a plurality of trial images are sequentially reconstructed with change of the rotating angle for the data representing the odd number echo So.

Figure 8B:
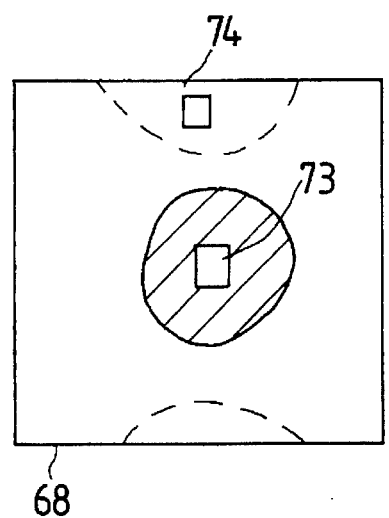

The evaluation value R is reduced through the repetition. Curve 55 in FIG. 9 indicates the change of the evaluation value R through the repetition. When the value $\Delta R$ is found negative at step 109, the new rotating angle $\Delta o$, which is indicated as $(\Theta k + \Delta \Theta)$ in FIG. 9, exceeds a suitable rotating angle to minimize the intensity of the artifacts. In this embodiment, the suitable rotating angle is determined to be $(\Theta k + \Delta \Theta / 2)$. Namely, the value $(\Theta o - \Delta \Theta / 2)$ is calculated as a final rotating angle (step 114). A final phase compensation is executed at step 115 by employing the final rotating angle. Then, the compensated data set is subjected to two-dimensional Fourier transformation to obtain a final image data (step 116). The image data is displayed on an image screen (step 117). Thus, an image, in which artifacts due to phase difference between odd number echo signals and even number echo signals are minimized, is obtained as indicated by display 68 in FIG. 8B.

In this embodiment, the sample regions 73 and 74 should not be changed through the repetition of trial. However, various modifications can be applied for the evaluation of image quality. Further, it is possible to rotate the data representing the even number echo signals instead of the data representing the odd number echo signals. Any of this pulse sequences shown in FIGS. 2, 4 and 5 can be employed for data acquisition.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

What is claimed is:

1. A magnetic resonance imaging method for obtaining an image of magnetization in a region of interest to which a homogeneous static magnetic field is applied, the method comprising the steps of:

(a) exciting magnetization in the region of interest:

(b) applying to the static magnetic field a readout gradient which is alternately switched between gradients of opposite polarity so as to generate a first series of echo signals of the excited magnetization;

(c) detecting and storing peak positions of the first series of echo signals in respective phase periods of the readout gradient;

(d) exciting again magnetization in the region of interest;

(e) simultaneously applying to the static magnetic field the readout gradient in the same manner as in the step (b) and a phase encoding gradient so as to generate a second series of echo signals of the excited magnetization, wherein the phase encoding gradient is applied along a direction orthogonal to the readout gradient;

(f) acquiring echo data by detecting the second series of echo signals and by sampling waveforms of the detected signals in respective phase periods of the readout gradient and by controlling sampling start timings in respective phase periods of the readout gradient on the basis of respective peak positions stored in the step (c); and (g) forming the image of magnetization by subjecting the echo data to two-dimensional Fourier transformation.

2. A magnetic resonance imaging method according to claim 1, wherein the phase encoding gradient applied in the step (e) includes a plurality of phase encoding gradient pulses, and wherein another series of field gradient pulses including the phase encoding gradient pulses and additional gradient pulses which cancel the effect of each of the phase encoding pulses are applied in the step (b).

3. A magnetic resonance imaging apparatus for obtaining an image of magnetizations in a region of interest to which a homogeneous static magnetic field is applied, comprising:

means for exciting magnetizations in the region of interest;

means for applying to the static magnetic field a readout gradient which is alternately switched between gradients of opposite polarity so as to generate a first series of echo signals of the excited magnetizations;

means for detecting and storing peak positions of the first series of echo signals in respective phase periods of the readout gradient;

the means for exciting magnetizations being controlled for again exciting magnetizations in the region of interest;

the means for applying the readout gradient to the static magnetic field being controlled for simultaneously applying the readout gradient with a phase encoding gradient applied by means for applying the phase encoding gradient so as to generate a second series of echo signals of the excited magnetizations, wherein the phase encoding gradient is applied along a direction orthogonal to the readout gradient;

means for acquiring echo data including means for detecting the second series of echo signals and for sampling waveforms of the detected signals in respective phase periods of the readout gradient and for controlling sampling start timings in respective phase periods of the readout gradient on the basis of respective peak positions stored in the detecting and storing means; and means for forming the image of magnetizations by subjecting the echo data to two-dimensional Fourier transformation.

* * * * *